United States Patent
Jameson et al.

(10) Patent No.: US 8,654,561 B1
(45) Date of Patent: Feb. 18, 2014

(54) READ METHODS, CIRCUITS AND SYSTEMS FOR MEMORY DEVICES

(75) Inventors: John Ross Jameson, Burlingame, CA (US); John Dinh, Dublin, CA (US); Derric Lewis, Sunnyvale, CA (US); Daniel Wang, San Jose, CA (US); Shane Charles Hollmer, Grass Valley, CA (US); Nad Edward Gilbert, Gilbert, AZ (US); Janet Wang, Los Altos, CA (US)

(73) Assignee: Adesto Technologies Corporation, Sunnyvale, CA (US)

( * ) Notice: Subject to any disclaimer, the term of this patent is extended or adjusted under 35 U.S.C. 154(b) by 0 days.

(21) Appl. No.: 13/276,763

(22) Filed: Oct. 19, 2011

Related U.S. Application Data

(60) Provisional application No. 61/408,231, filed on Oct. 29, 2010.

(51) Int. Cl.
  *G11C 11/00* (2006.01)
(52) U.S. Cl.
  USPC .................... 365/148; 365/158; 365/207
(58) Field of Classification Search
  USPC ............... 365/148, 158, 205, 207, 185.21
  See application file for complete search history.

(56) References Cited

U.S. PATENT DOCUMENTS

| | | | |
|---|---|---|---|
| 5,761,115 A | 6/1998 | Kozicki et al. | |
| 6,487,106 B1 | 11/2002 | Kozicki | |
| 6,635,914 B2 | 10/2003 | Kozicki et al. | |
| 7,106,614 B2 | 9/2006 | Symanczyk | |
| 7,126,152 B2 | 10/2006 | Ishida et al. | |
| 7,167,390 B2 | 1/2007 | Ishida et al. | |
| 7,209,379 B2 | 4/2007 | Mori et al. | |
| 7,239,542 B2 | 7/2007 | Ootsuka et al. | |
| 7,242,606 B2 | 7/2007 | Hachino et al. | |
| 7,359,236 B2 | 4/2008 | Gilbert | |
| 7,411,854 B2 | 8/2008 | Klostermann et al. | |
| 7,426,131 B2 | 9/2008 | Gilbert | |
| 7,457,145 B2 | 11/2008 | Kund et al. | |
| 7,508,709 B2 * | 3/2009 | Seong et al. | 365/185.12 |
| 7,514,706 B2 | 4/2009 | Gilbert | |
| 8,203,899 B2 * | 6/2012 | Chen et al. | 365/207 |
| 2006/0139989 A1 | 6/2006 | Gruning Von Schwerin et al. | |
| 2010/0195370 A1 | 8/2010 | Shiimoto et al. | |

* cited by examiner

*Primary Examiner* — David Lam

(57) ABSTRACT

A memory device can include a plurality of programmable elements; at least one sense circuit that generates sense data values from detected impedances of accessed programmable elements; and at least one data store circuit that stores initial data values from the at least one sense circuit, and stores output data values from the at least one sense circuit after check conditions have been applied to at least one programmable element. The check conditions can induce a change in impedance for programmable elements programmed to at least one predetermined state. Methods can include reading data from at least one memory cell of a memory device comprising a plurality of such memory cells; if the read data has a first value, providing such data as an output value; and if the read data has a second value, repeating access to the memory cell to confirm the read data value.

33 Claims, 12 Drawing Sheets

(State = 1)

(State = 1')

(State = 0)

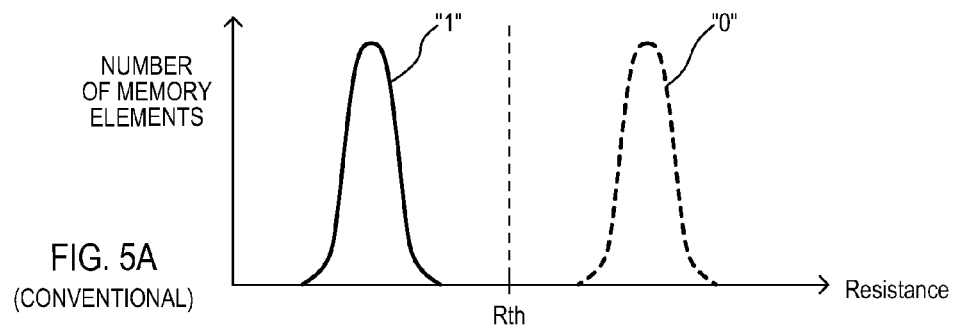
FIG. 5A
(CONVENTIONAL)

READ METHODS, CIRCUITS AND SYSTEMS FOR MEMORY DEVICES

This application claims the benefit of U.S. Provisional Patent Application Ser. No. 61/408,231 filed on Oct. 29, 2010, the contents of which are incorporated by reference herein.

TECHNICAL FIELD

The present disclosure relates generally to memory devices, and more particularly to memory devices having memory elements that can have dynamic changes in impedance during read operations.

BACKGROUND

Conventional memory devices typically access stored data values with read operations. Conventional read operations can access memory cells to generate read signals based on a state of one or more memory elements within the cell. Such read signals can be compared to some threshold value to thereby determine a value of the data stored (e.g., "1" or "0"). Many memory devices seek to access data values as quickly as possible in a single read operation.

In some conventional memory devices that utilize resistive memory elements, such as resistive random access memories (RRAMs), in order to meet data retention requirements, programmable elements may be driven with a voltage sufficient to ensure that such elements maintain a resistance value (e.g., high or low resistance) over an extended period of time. However, driving programmable resistance elements in such a manner can affect device endurance. At the same time, in some RRAM technologies, resistance values of programmed elements may change over time, presenting a data retention limit in such devices. Data retention and device endurance can be important aspects of a memory device in many applications.

BRIEF DESCRIPTION OF THE DRAWINGS

FIG. 5A is a graph showing conventional static distributions of programmable resistance elements.

DETAILED DESCRIPTION

Below embodiments show methods for reading data from a memory element in which, if a read operation detects a particular value, read operations can continue to confirm that the memory element stores such a value. As will shown in more detail below, in some embodiments, "check" conditions can be applied after an initial read results that introduce energy to a memory element which can cause it to switch from a first value to a second value.

In other embodiments, the time required to induce a change in impedance (referred to herein as a "time to breakdown") can determine a stored data value.

Thus, states of memory elements can be checked more than once, or extended over a period of time, after read operations determine an initial data state. In addition or alternatively, a time to breakdown can be used alone, or in combination with other read techniques to determine a stored data value.

In the below descriptions, references are made to "program" and/or "erase" operations. It is noted that such operations should not be construed as inducing any particular impedance state (i.e., low/high resistance), as such operations can induce changes in memory elements that vary according to technology. That is, while for some technologies a programming operation can lower impedance of an element, in other technologies, programming operations can alter a time to breakdown, increase impedance, or vary capacitance as just a few possible examples. Program and/or erase can be considered variations on write operations.

The circuits and methods shown herein can include programmable memory elements that include a dielectric material disposed between two electrodes, where such a dielectric can include an ion conductor material. In one particular example, such an ion conductor material can include germanium disulfide ($GeS_2$) with a metal therein (e.g., silver and/or copper). However, alternate embodiments can include memory elements based on other materials, including silicon oxide (or silicon oxide-like) dielectrics, memory elements relying on graphene as a programmable matrix, and/or memory elements utilizing a metal oxide as a programmable material, such as titanium oxide, copper oxide, or other transition metal oxides, as but a few examples. Such a list of materials should not be construed as limiting. Any suitable programmable element structure can be employed in the embodiments.

In the figures below, it is understood that responses shown in graphs are illustrative and can vary according to implementation.

Figure 1:
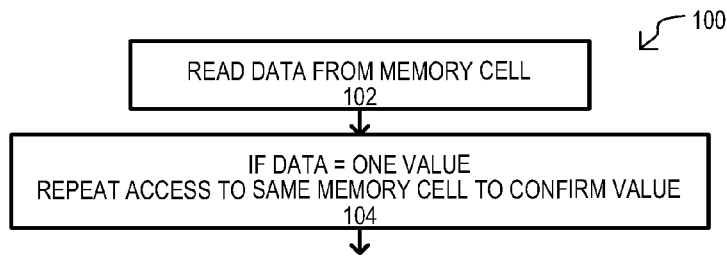
FIG. 1 is a flow diagram of a method of reading data from a memory device according to an embodiment.

FIG. 1 is a flow chart showing a method 100 according to one embodiment. A method 100 can include reading data from a memory cell (102). Unlike a conventional approach, which can generate output values from such read data, if the read data has a particular value, a read operation can be repeated to confirm the data value (104). In some embodiments, confirming a data value can include applying "check conditions" to the memory cell that can apply energy to the memory cell to induce a change in memory cell properties. However, it is understood that check conditions are not programming (or write) conditions. In very particular embodiments, check conditions can include one or more electrical pulses and/or a continuation of the read conditions. However, in other embodiments, check conditions can include the application of other forms of energy, such as heat, to storage elements of a memory cell.

In this way, if a read operation initially determines that a memory cell has one state, a read operation can continue or be repeated to ensure that the memory cell maintains the state.

A method like that described above, or an equivalent, can be utilized in various memory types, as will be described in more detail below. However, such a method can be particularly applicable to memory elements that store data according to impedance changes, such as a memory elements based on conductive bridging random access memory (CBRAM) type cells or programmable metallization cells (PMCs). It has been found by the inventors that in some cases such memory elements can initially appear to store one data state (e.g., high resistance) when previously programmed to another data state (low resistance). Conventionally, such a response would be considered undesirable. However, according to a method like that above, such elements can be correctly read as being in the programmed state, as the check conditions can cause such elements to switch from a high resistance to a lower resistance. In some embodiments, elements can be intentionally programmed to such a state, relying on a read method to ignore an initially read value until after the value has been confirmed.

Figure 2A:
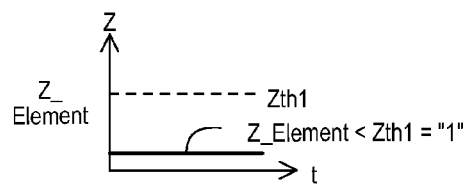
FIGS. 2A to 2C are timing diagrams showing a method of reading data from a programmable impedance element that includes selectively applying check conditions based on a detected element impedance.
Figure 2B:
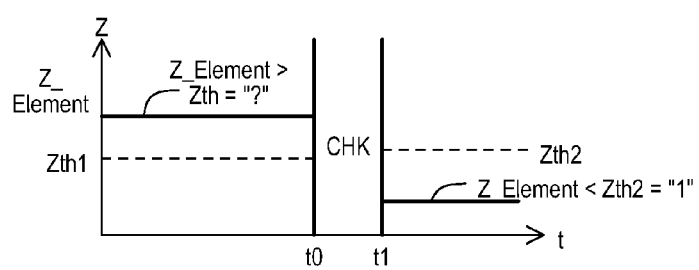
Figure 2C:
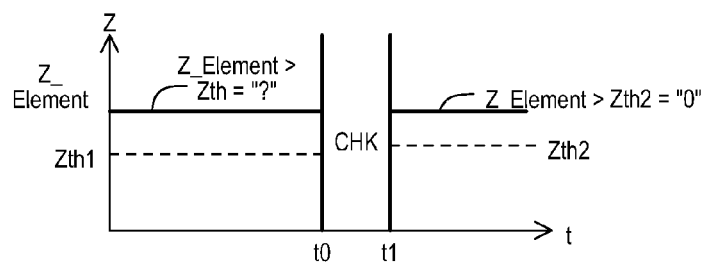

FIGS. 2A to 2C show a method of reading according to a particular embodiment. FIGS. 2A to 2C are timing diagrams showing an element impedance (Z_Element) over time (t).

FIG. 2A shows a read operation of a memory element having a first state (shown as state 1) according to an embodiment. An impedance of a memory element (Z_Element) can be compared to a threshold impedance (Zth1). In the example shown, Z_Element can be less than Zth1, which can be determined to be a valid state (e.g., output as a logic "1").

FIG. 2B shows a read operation of a memory element having a second state (shown as state 1'). An impedance of a memory element (Z_Element) can be compared to threshold impedance (Zth1). In the example shown, Z_Element can initially be greater than Zth1. However, such an initial state is not determinative of a stored data value. Instead, at time t0, check conditions (CHK) can be applied to the memory element that can apply energy to the memory element. As noted above, check conditions are different from program or erase (or other write) conditions.

At time t1, following the application of check conditions, an impedance of a memory element (Z_Element) can be compared to a threshold impedance (Zth2). In the example shown, Z_Element can be less than Zth2, which can be determined to be the stored data values (e.g., output as a logic "1").

FIG. 2C shows a read operation of a memory element having a third state (called 0, in this example). As in the case of FIG. 2B, an impedance of a memory element can be initially compared to an initial threshold impedance (Zth1), with the initial state not determining the stored data value. At time t0 check conditions (CHK) can be applied. At time t1, following the application of check conditions, an impedance of a memory element can be compared to threshold impedance (Zth2). In contrast to FIG. 2B, an impedance of Z_Element can be greater than Zth2, which can be determined to be a valid state (e.g., output as a logic "0").

It is noted that in some embodiments, an initial threshold impedance can be different from a threshold impedance following the application of check conditions (i.e., Zth1≠Zth2). However, in other embodiments, an initial threshold impedance can be the same as a threshold impedance following the application of check conditions (i.e., Zth1=Zth2).

It is also noted that while FIGS. 2A to 2C describe read operations in which an element impedance can be checked to determine if it is greater than a threshold, in other embodiments an impedance of an element can be checked to determine if it is less than a threshold impedance, or checked to determine if it is within one or more bounded impedance ranges.

Programmable impedance elements according to embodiments herein can exhibit dynamic changes during read operations. In some embodiments, such changes can be relatively sudden, changing in relatively short time with respect to the application of check conditions. However, in other embodiments such changes can be more gradual, with an impedance of an element changing throughout, or during most of, the time when check conditions are applied.

Figure 3:
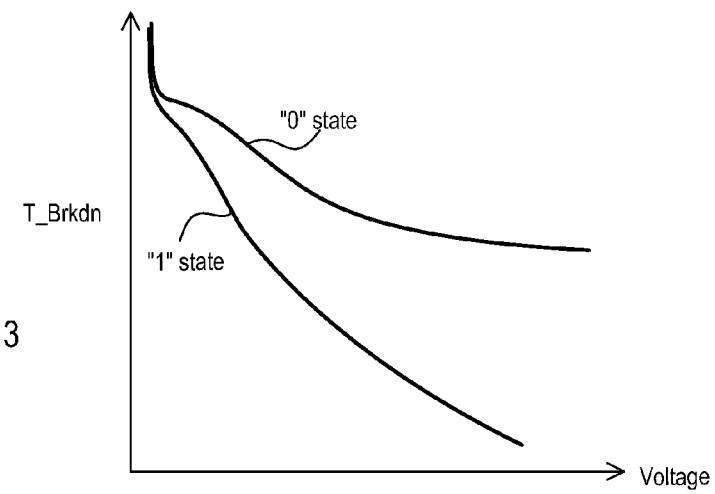
FIG. 3 is a graph showing a "breakdown" response of memory elements according to one embodiment.

FIG. 3 shows responses of memory elements according to one particular embodiment. FIG. 3 is a graph showing a time to breakdown with respect to an applied voltage. The memory elements of FIG. 3 can include a dielectric or dielectric-type material between two electrodes. Upon application of a check condition (in this embodiment a voltage) an element dielectric can "breakdown", forming a substantially conductive path through the dielectric, where such a path was not previously present. However, unlike some conventional capacitor breakdowns and/or anti-fuse type structures, a state of a programmable can be reversed back to the previous (non-breakdown, or high impedance/resistance) state.

FIG. 3 includes with two curves, one representing a first state (0) of an element, the other representing a second state (1) of an element. As shown, for a given check condition (e.g., voltage), depending upon the element state (e.g., 1 or 0), breakdown can occur at a different point in time. Such a characteristic can be used to store data values.

In this way, programmable elements can store data values based on a dynamic change in impedance, as opposed to being based on a static impedance of such elements. This is in contrast to conventional resistive random access memory (RRAM) devices, which sense static resistance, dynamic RAM (DRAM) devices, which can sense a charge based on a static capacitance, and electrically erasable and programmable read only memories (EEPROMs), which can sense current based on a static transistor threshold voltage.

Figure 4:
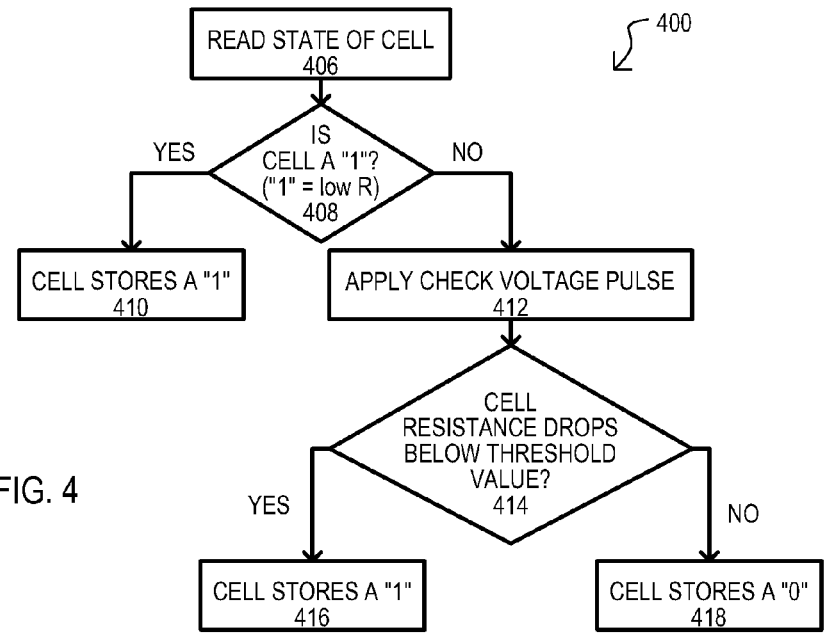
FIG. 4 is a flow diagram showing a method of reading data from a memory device according to another embodiment.

FIG. 4 is a flow diagram showing a method 400 according to an embodiment. A method 400 can include reading a state of a cell (406). Such an action can include any of various read methods depending upon cell type. As but a few examples, reading a state of a cell can include detecting a current and/or voltage based on an impedance or change in impedance, including detecting a stored charge, as but a few possible examples. A determination can be made as to the memory cells state (408). In the embodiment shown, a determination can be made to check of the cell is a logic "1". In some embodiments, such an action can include comparing a measured state of a cell to one or more limits, or thresholds. In a very particular embodiment, a logic "1" can correspond to a low cell resistance (e.g., a resistance less than a threshold).

If a memory cell is initially found to store one particular value (YES from 408), the memory cell can be determined to store that value (410).

In contrast, if a memory cell is initially found to store a different value (NO from 408), check conditions can be applied to the memory cell. In the embodiment of FIG. 4, application of check conditions can include applying one or more voltage pulses (412). Check condition voltage pulses are not of sufficient magnitude to write a particular data value into an element (e.g., can be below levels of pulses used to program or erase).

Following the application of check conditions, a state of the memory cell can be checked again, which in the this particular embodiment can include determining if a resistance of the memory cell has dropped below a threshold value during, or in response to, the check conditions (414). If a memory cell is found to have one state (e.g., resistance has dropped below the threshold value), it can be determined to store one value, in this case a logic "1" (416). However, if a memory cell is found to have a different state (e.g., resistance has not dropped below the threshold value) it can be determined to store a different value, in this case a logic "0" (418).

In this way, a method can include accessing a memory after applying check conditions to confirm that the memory cell stores a particular value.

Method 400 of FIG. 4 should not be construed as being limited to any particular memory type. However, in embodiments having programmable resistance elements, a method 400 can reduce data retention requirements of a memory device. In particular, in some resistive memory (e.g., RRAM) technologies, a cell programmed to one state (e.g., low resistance) can drift or otherwise change to another state (e.g., high resistance). Conventionally, a memory cell in such a state would result in erroneous data, as a high resistance would be detected when the cell was supposed to be programmed to a low resistance. To address such drift in resistance, conventionally, a memory device can reprogram elements within a certain amount of time to ensure a low resistance state is maintained. Utilizing a method 400 (or an equivalent method), application of check conditions can cause such a memory cell to change from a high resistance to a low resistance, without requiring a full programming operation and/or error check operation. This can result in substantially longer data retention times for such memory cells.

Figure 5B:
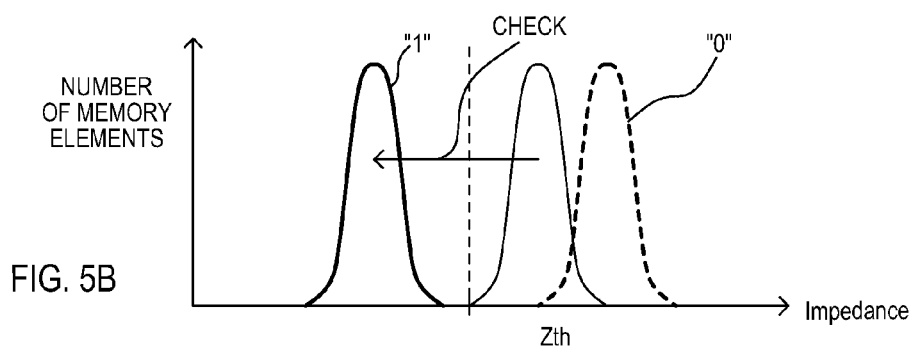
FIG. 5B is a graph showing dynamic responses of resistance elements according to an embodiment.

FIGS. 5A and 5B are graphs comparing conventional memory cell data storage states to those according to one embodiment.

FIG. 5A shows a conventional arrangement in which memory cells are programmed to one state "0", can have a resistance above a threshold value (Rth). Memory cells programmed to another state "1", can have a resistance below the threshold value (Rth).

FIG. 5B shows memory cells according to an embodiment. Memory cells programmed to one state "0", can have an impedance above a threshold value (Zth). In some cases memory cells programmed to the state "1", can also have an impedance above the same threshold value (Zth). However, following the application of check conditions (CHECK), memory cells programmed to the state "1" can have an impedance that falls below the threshold value (Zth). In contrast, memory cells programmed to the "0" state can have an impedance that remains above the threshold value (Zth). That is, in particular embodiments, a read operation induces a dynamic change in element impedance.

It is noted that distribution shapes shown in FIG. 5B are exemplary. Distributions can have different shapes depending upon device structure, program and erase conditions, as well as check conditions.

While some embodiments can apply check conditions that are separate in time from an initial read operation, and/or different in magnitude and/or duration than an initial read operation, in other embodiments, a read operation can include a continuous application of conditions to induce a change in impedance. Examples of such embodiments will now be described.

Figure 6:
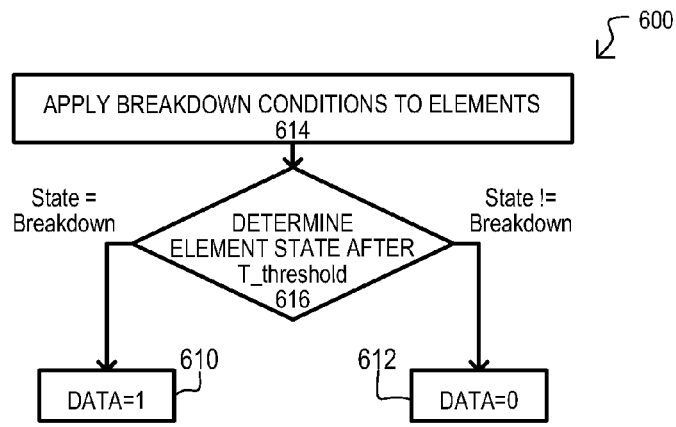
FIG. 6 is a flow diagram showing a method of reading data from a memory device according to a further embodiment.

FIG. 6 is a flow diagram showing a method 600 according to another embodiment. In some embodiments, a method 600 can operate on elements having variations in breakdown time, such as those shown in FIG. 3.

Method 600 can include applying breakdown conditions to one or more memory elements (614). In some embodiments, such an action can include applying a voltage across a memory element. Such a voltage can be a static voltage, or can be a series of voltage pulses, or other suitable dynamic waveforms. However, in other embodiments such an action can include applying different forms of energy, such as enabling heat flow to a memory element (i.e., into or out of a memory element).

Following a threshold time period (T_threshold), a determination of a memory element state can be made (616). Such an action can determine if a memory element is in a breakdown state. A breakdown state can result from a relatively fast change from one impedance to one or more other impedances under the applied breakdown conditions. In some embodiments, a change to a breakdown state can be detected by a relatively fast decrease in voltage across an element and/or a relatively sudden increase in current through an element.

If an element is determined to have the breakdown state (State=Breakdown from 616), the memory cell can be determined to store one data value (610) (in this case, a "1").

In contrast, if an element does not have the breakdown state (State !=Breakdown from 616), the memory cell can be determined to store a different data value (612) (in this case, a "0").

It is noted that while FIG. 6 shows a binary system, alternate embodiments can include multiple threshold times for programmable elements capable of being written to more than two different states.

In this way, a method can include determining a data value based on a time to breakdown of an element, as opposed to an impedance of the element.

It is also noted that in some embodiments, two or more data states can exhibit a time to breakdown under the applied breakdown conditions. In very particular embodiments, elements in different states both end in the breakdown state, with one element taking longer than the other under the same conditions.

Figure 7:
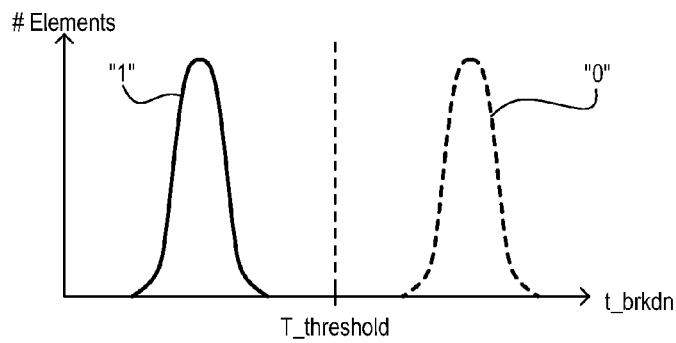
FIG. 7 is a graph showing time-to-breakdown distributions of programmable impedance elements according to an embodiment.

FIG. 7 is a graph showing memory element responses according to one particular embodiment. FIG. 7 shows distributions of elements programmed into different states ("1" and "0") versus a time-to-breakdown (t_brkdn). A time-to-breakdown can be the amount of time to induce a change in impedance in memory elements under the same time-to-breakdown conditions.

In one embodiment, the distribution of FIG. 7 can represent a response of elements like those shown in FIG. 3 and/or the response of elements included in the method of FIG. 6.

As shown, elements programmed to one state "1", can have breakdown times less than a threshold time (T_threshold). Elements programmed to another state "0", can have breakdown times greater than a threshold time (T_threshold).

It is noted that distribution shapes shown in FIG. 7 are exemplary. Distributions can have different shapes depending upon device structure, program and erase conditions, as well as check conditions.

Figure 8:
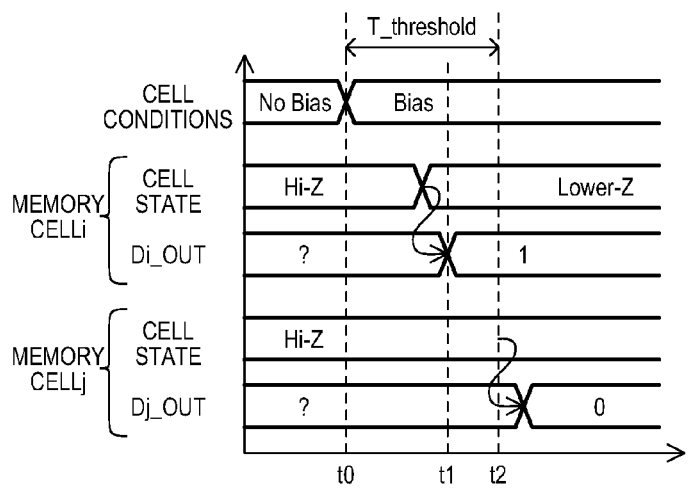
FIG. 8 is a timing diagram showing a time-to-breakdown read operation according to an embodiment.

Referring now to FIG. 8 a timing diagram shows read operations according to an embodiment. FIG. 8 includes a number of waveforms: CELL CONDITIONS, which shows when bias conditions are applied to memory cells; MEMORY CELLi, which shows a response of a memory cell programmed to one state; and MEMORY CELLj, which shows a response of a memory cell programmed to another state. CELL STATE shows an impedance state of each memory cell. Di_OUT/Dj_OUT show data values corresponding to each memory cell.

Prior to time t0, no bias conditions are applied to the cells. Further, such cells can have an initial, high impedance state (Hi-Z), which can be conceptualized as a "non-breakdown" state. At this time, an output value for such cells (Di_OUT/Dj_OUT) can be undetermined (represented by "?").

At about time t0, bias conditions can be applied to the memory cells. Such bias conditions can be conceptualized as breakdown inducing conditions.

At about time t1, CELLi can "breakdown", changing from a Hi-Z state to a lower impedance state (Lower-Z). Such an action can indicate the memory cell (CELLi) stores a data value "1". As a result, Di_OUT can be determined to be "1". At the same time, CELLj does not breakdown, maintaining a Hi-Z state.

At about time t2, a threshold time (T_threshold) can have passed since the application of the bias conditions. At this time, CELLj continues to have a Hi-Z state. As result, Dj_OUT can be determined to be a "0".

Figure 9:
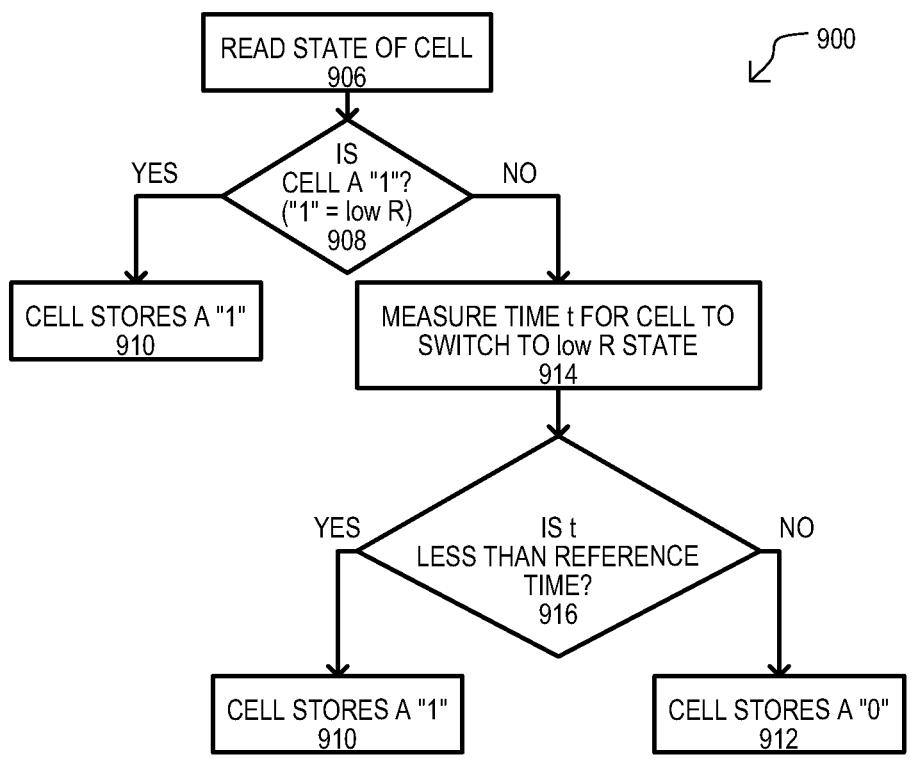
FIG. 9 is a flow diagram showing a method of reading data from a memory device according to another embodiment.

FIG. 9 shows a method 900 according to yet another embodiment. In one embodiment, a method 900 can operate on elements having variations in breakdown time, such as those shown in FIG. 3.

Method 900 can include reading a state of a cell (906). Such an action can include any of various read methods depending upon cell type. As but a few examples, such an action can detect a resistance, capacitance, or combination thereof. A determination can be made as to the memory cells state (908). In the embodiment shown, a determination can be made to check if the cell is a logic "1". In a very particular embodiment, a logic "1" can correspond to a cell resistance being lower than some threshold resistance. In some embodiments, such a threshold resistance can be static. However, in other embodiments such a threshold resistance can be dynamic, changing during the sensing operation and/or changing according to a state of a device, including operating conditions (e.g., operating voltage or temperature) and/or wear level (number of read or write cycles performed).

If a memory cell is initially found to store one particular value (YES from 908), the memory cell can be determined to store that value (910).

If a memory cell is initially found to store a different value (NO from 908), a time required for a cell to switch from a first state (e.g., higher resistance) to a second state (e.g., lower resistance) can be measured (916). If a measured time is less than a reference time (YES from 916), a cell can be determined to have one state (in this case a "1") (910). If a measured time is greater than a reference time (NO from 916), a cell can be determined to have another state (in this case a "0") (912).

It is noted that in the embodiment of FIG. 9, regardless the state of the memory cell, the memory cell ends in a particular impedance state (e.g., low resistance).

In this way, a time to breakdown (time to switch in impedance) can be used to determine a data value stored in a programmable element.

Figure 10A:
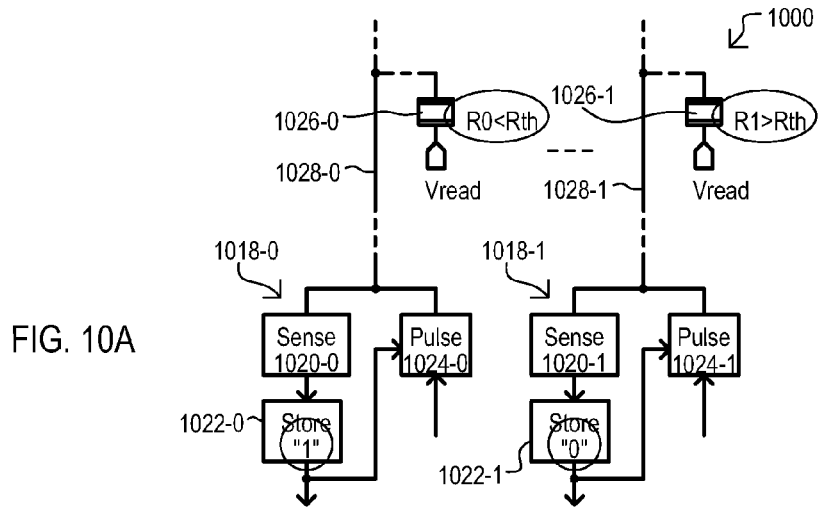
FIGS. 10A to 10C are block schematic diagrams showing read circuits and read operations of a memory device according to an embodiment.
Figure 10B:
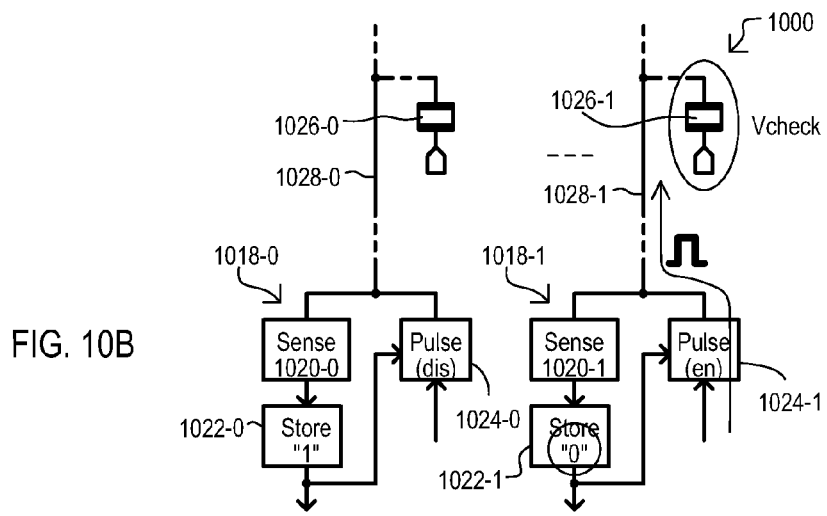
Figure 10C:
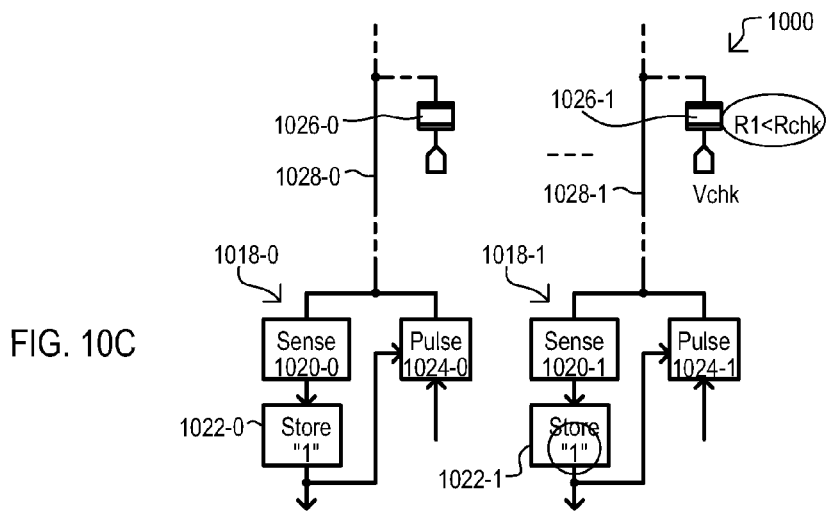

FIGS. 10A to 10C show a read circuit and corresponding read operations according to one particular embodiment. Each of FIGS. 10A to 10C shows a device 1000 having read circuits (two shown as 1018-0/1), each of which can be connected to a memory element 1026-0/1 by a corresponding bit line 1028-0/1. It is understood that each read circuit 1018-0/1 can be connected to additional memory elements on the corresponding bit line 1028-0/1. Also, memory elements 1026-0/1 can be directly connected to a bit line 1028-0/1 or can be connected to a bit line through one or more access devices. Similarly, bit lines 1028-0/1 can be connected to read circuits 1018-0/1 directly, or via one or more selection circuits.

Particular array architectures of a device 1000 according to embodiments will be described in more detail below in FIGS. 14 to 17B.

Memory elements 1026-0/1 can be programmable between two or more resistive states. In one embodiment, memory elements 1028-0/1 can be programmed by application of one or more voltage pulses having a particular amplitude, polarity and duration. Further, in one embodiment, memory elements 1026-0/1 can respond like those shown in FIGS. 2A to 2C.

Referring to FIG. 10A, in a read operation according to one embodiment, sense circuits 1020-0/1 can be activated to sense a resistance of a corresponding memory element 1026-0/1. Any suitable method can be utilized, including but not limited to: determining a current drawn by a memory element in response to a voltage and/or determining a voltage drop across a memory element. In the embodiment shown, memory element 1026-0 can initially have a resistance less than a threshold resistance (R0<Rth). Such a value is sensed as a "1" by sense circuit 1020-0, resulting in a "1" value being stored in store circuit 1022-0.

Referring still to FIG. 10A, in contrast to memory element 1026-0, memory element 1026-1 can initially have a resistance greater than a threshold resistance (R1<Rth). This can be initially sensed as a "0" by sense circuit 1020-1, resulting in a "0" value being stored in store circuit 1022-1.

Referring now to FIG. 10B, a read operation can continue by applying check conditions to memory elements. The embodiment of FIG. 10B shows a selective application of a check conditions based on an initially sensed data value. In the particular embodiment shown, if a first value is sensed (in this case "1"), check conditions are not applied to the corresponding memory element. However, if second value is sensed (in this case "0"), check conditions are applied to the corresponding element. In FIG. 10B, the application of a check conditions can include applying a check voltage pulse (Vcheck) across a memory element. In one embodiment, such a check voltage pulse can apply less energy than that used to program (or erase) a memory element.

In the particular embodiment of FIG. 10B, each pulse control circuit 1024-0/1 can be enabled by a value in the corresponding store circuit 1022-0/1. Accordingly, because store circuit 1022-0 stores a first value, pulse control circuit 1024-0 can be disabled. However, because store circuit 1022-1 stores a second value, pulse control circuit 1024-1 can be enabled, allowing a check voltage pulse to be applied across memory element 1026-1.

Referring to FIG. 10C, a read operation can continue by sense circuit 1020-1 (and optionally sense circuit 1020-0) being activated once again to sense a resistance of a corresponding memory element. In the embodiment shown, memory element 1026-1 has a resistance less than a check resistance (R1<Rchk). Such a value is sensed as a "1" by sense circuit 1020-1, resulting in a "1" value being stored in store circuit 1022-1. As noted above, Rchk=Rth in some embodiments.

In this way, a memory device can store sensed resistance values, and selectively apply check conditions to memory elements having particular logic values.

It is understood that while FIGS. 10A to 10C show selective application of check conditions, other embodiments can include non-selective application of check conditions. That is, check conditions could be applied to memory elements regardless of a detected value.

FIGS. 11A to 11D show various examples of program and check pulses according to embodiments. A program pulse can be a pulse used to establish a state of a programmable element. In contrast, a check pulse can be applied to a programmable element to confirm a stored value, as described in the embodiments herein. FIGS. 11A to 11D are graphs showing an amplitude of a pulse (E) applied to a memory element with respect to time (t).

Figure 11A:
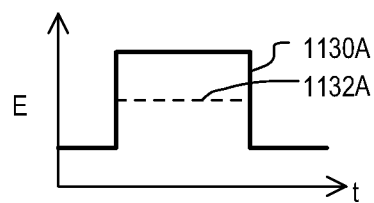
FIGS. 11A to 11D are timing diagrams comparing program pulses to check pulses according to embodiments.

FIG. 11A shows how a check pulse 1132A can have a smaller amplitude than a program pulse 1130A.

Figure 11B:
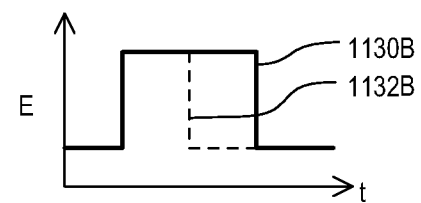

FIG. 11B shows how a check pulse 1132B can have a shorter duration than a program pulse 1130B, but substantially a same amplitude.

Figure 11C:
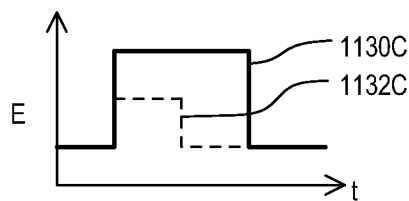

FIG. 11C shows how a check pulse 1132C can have a shorter duration and smaller amplitude than a program pulse 1130C.

Figure 11D:
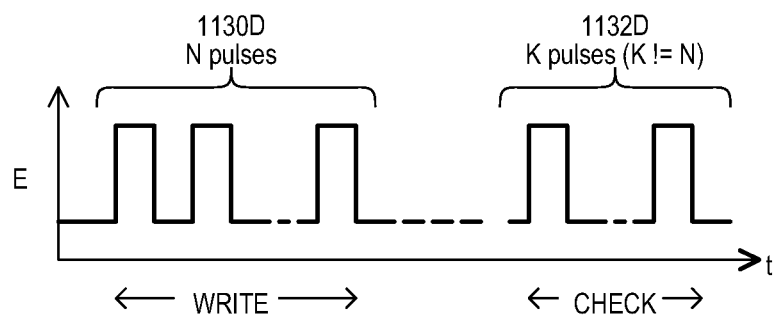

FIG. 11D shows how a number of check pulses 1132D can be fewer than a number of program pulses 1130D.

As noted above, while for some technologies a program operation can change an impedance from a high to low impedance, other technologies such program operations can have different effects (e.g., changing a time to breakdown, increasing an impedance). Further, pulses like those shown above, can have a reverse polarity. Still further, for some technologies pulses of one polarity can write one data value, while pulses of another polarity can write a different data value. Even further, pulse length, duration, number can be varied to write more than two states in the case of multi-state (greater than two states) memory elements.

Figure 12A:
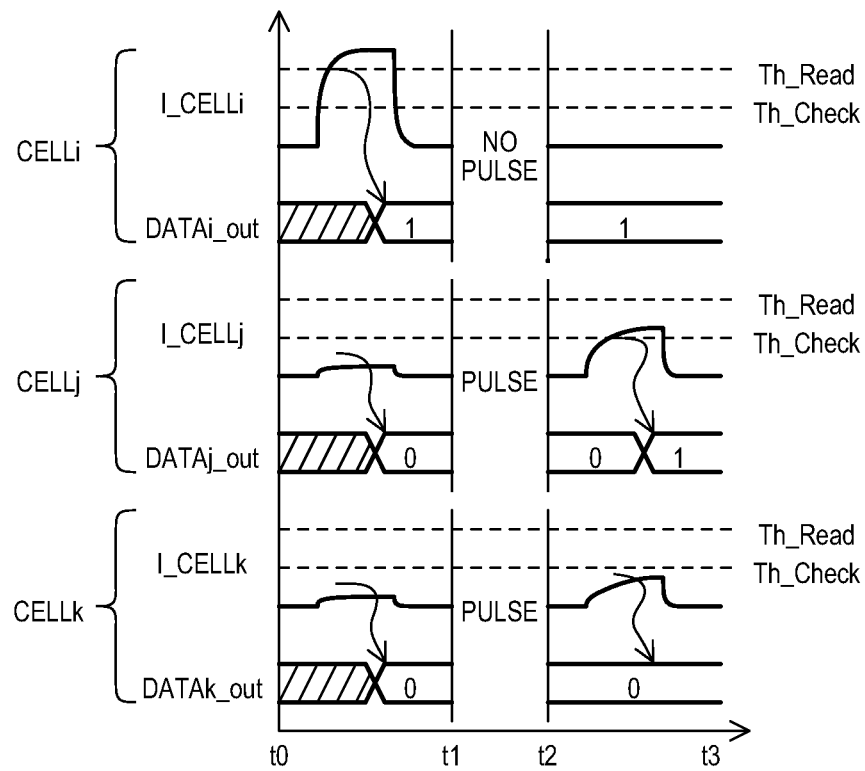
FIGS. 12A and 12B are timing diagrams showing read operations according to additional embodiments.
Figure 12B:
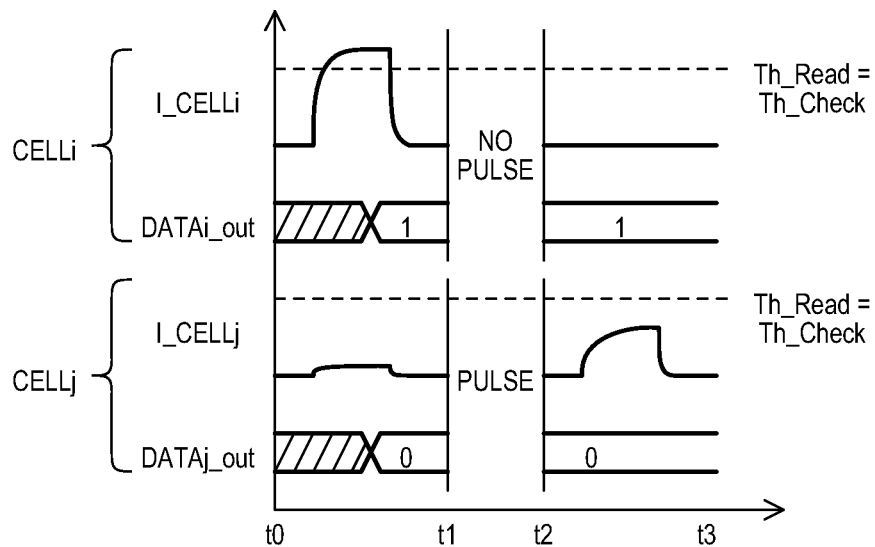

FIGS. 12A and 12B show read operations according to additional embodiments. FIGS. 12A and 12B can be one implementation of read operations like those show in FIGS. 2A to 2C, in which memory elements can have dynamic changes in impedance during a read operation. In FIGS. 12A and 12B, it is assumed that an electrical current or voltage pulse is applied across memory elements. In response to such a pulse, a sense signal can be generated from the memory elements.

FIG. 12A is a timing diagram showing a response of three different memory cells CELLi, CELLj and CELLk. The timing diagram includes sense signals (I_Celli, I_Cellj, I_Cellk) generated for three different memory cells, as well as data values (DATAi_out, DATAj_out, DATAk_out) corresponding to such sense signals. As noted above, sense signals (I_Celli, I_Cellj, I_Cellk) can be sensed current values, sensed voltage values, or combinations thereof.

Referring still to FIG. 12A, between times t0 and t1, a read electrical pulse can be applied to the memory cells. Sense signal I_Celli can exceed a read threshold Th_Read, and thus generate a data value "1". In contrast, sense signals I_Cellj and I_Cellk are both below level Th_Read, and thus generate initial data values "0".

Between times t1 and t2, a check pulse can be applied to those memory cells generating a data value "0", which in this case can be memory cells CELLj and CELLk. In the embodiment shown, the check pulse is not applied to memory cell CELLi. However, as noted above, alternate embodiments can have a non-selective application of a check pulses.

Between times t2 and t3, a second read electrical pulse can be applied to at least those cells generating a value "0". In response to such a pulse, sense signal I_Cellj can exceed a check threshold Th_Check, and thus its corresponding data value can be changed from "0" to "1". However, sense signal I_Cellk can remain below level Th_Check, and thus its corresponding data value can continue to be "0".

After time t3, data values (DATAi_out, DATAj_out, DATAk_out) can be output as valid data values.

FIG. 12A shows an arrangement in which a check threshold is different than a read threshold (in this case lower than).

FIG. 12B shows a response of two different memory cells CELLi and CELLj, including sense signals (I_Celli, I_Cellj) generated for two different memory cells, as well as data values (DATAi_out, DATAj_out) corresponding to such sense signals. As in the case of FIG. 12A, sense signals (I_Celli, I_Cellj) can be sensed current values, sensed voltage values, or combinations thereof.

FIG. 12B shows a response like that of FIG. 12A, but with a check threshold that can be the same as a read threshold (Th_Read=Th_Check).

While FIGS. 12A and 12B show sense signals that rise in response to impedance changes, other embodiments can include sense signals that fall, or have other dynamic responses. That is, FIGS. 12A and 12B show but one of many possible sensing approaches, and so should not be construed as limiting.

Figure 13:
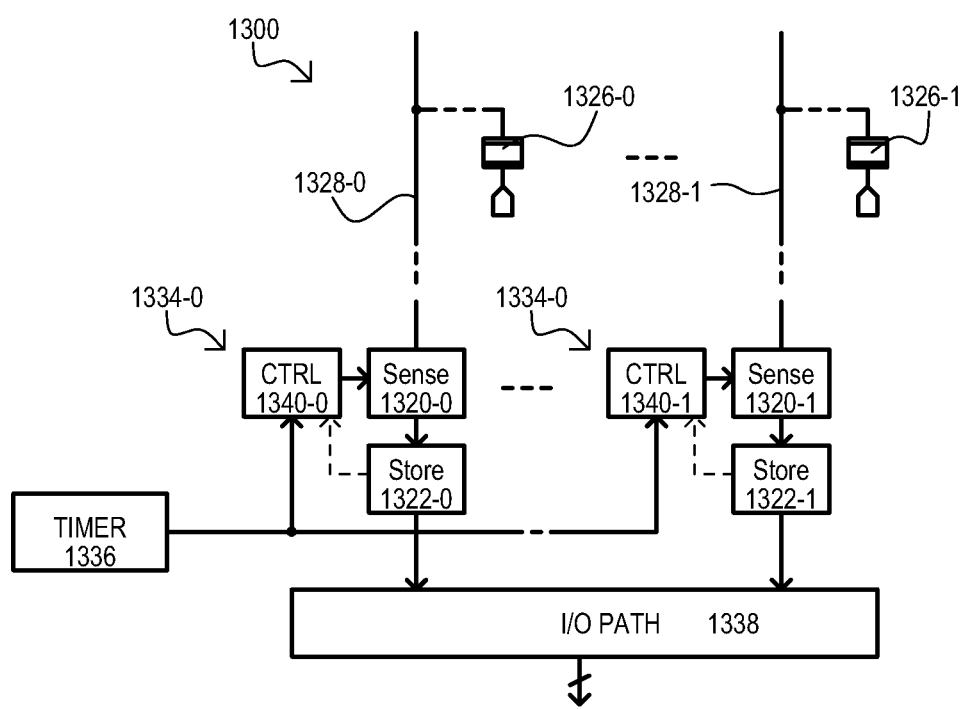
FIG. 13 is a block schematic diagram of read circuits of a memory device according to another embodiment.

FIG. 13 shows a read circuit 1300 according to another embodiment. FIG. 13 shows a device 1300 that can read data from memory elements (two shown as 1326-0/1) that can be programmable between two or more states having different times to breakdown, as described in embodiments above, or equivalents. Such memory elements 1326-0/1 can be programmed by application of one or more voltage pulses having a particular amplitude, polarity and duration. In a very particular embodiment, memory elements 1326-0/1 can respond like those shown in FIG. 3.

A device 1300 can include read circuits (1334-0/1), bit lines (1328-0/1), a timer circuit 1336, and an input/output (I/O) path 1338. As in the case of FIGS. 10A to 10C, each read circuit 1334-0/1 can be connected to additional memory elements on a corresponding bit line 1328-0/1. As in the case of FIG. 10A to 10C, memory elements 1326-0/1 can be directly connected to a bit line 1328-0/1 or can be connected to a bit line through one or more access devices. Similarly, bit lines 1328-0/1 can be connected to read circuits 1334-0/1 directly, or via one or more access devices.

Each read circuit 1334-0/1 can include a sense circuit 1320-0/1, a store circuit 1322-0/1, and a control circuit 1340-0/1. In a read operation, sense circuits 1320-0/1 can be periodically activated to determine if a "breakdown" condition has occurred. In some embodiments, sense circuits (1320-0/1) can include logic to determine which value to output to a corresponding store circuit (1322-0/1) based on inputs from timing circuit 1336. More particularly, a value output from sense circuits (1320-0/1) can vary based on the time of a sensing operation performed by the sense circuits (1320-0/1).

In one particular embodiment, according to outputs from a timing circuit 1336, control circuits 1340-0/1 can activate corresponding sense circuits 1320-0/1. If sense circuits 1320-0/1 detect breakdown in an initial period they can output one logic value, but if a breakdown is not detected within the initial period, a different logic value can be output. It is understood that while FIG. 13 shows a binary case, in which sense circuits can output 1 for one time period, and 0 afterward, in a multi-bit case, sense circuits can output multi-bit values as sense circuits checked for breakdown in each subsequent time period.

Results from operations of sense circuits 1334-0/1 can be stored as data values in corresponding store circuits 1322-0/1. Optionally, control circuits 1340-0/1 can selectively activate sense circuits based on a data value held within a corresponding store circuit 1322-0/1. In one embodiment, once breakdown has been detected in a memory element 1326-0/1, a corresponding sense circuit can be disabled.

Accordingly, a status of memory elements 1326-0/1 can be checked at subsequent points in time, with a time required to cause a change in state (e.g., breakdown) indicating a particular value.

Figure 14:
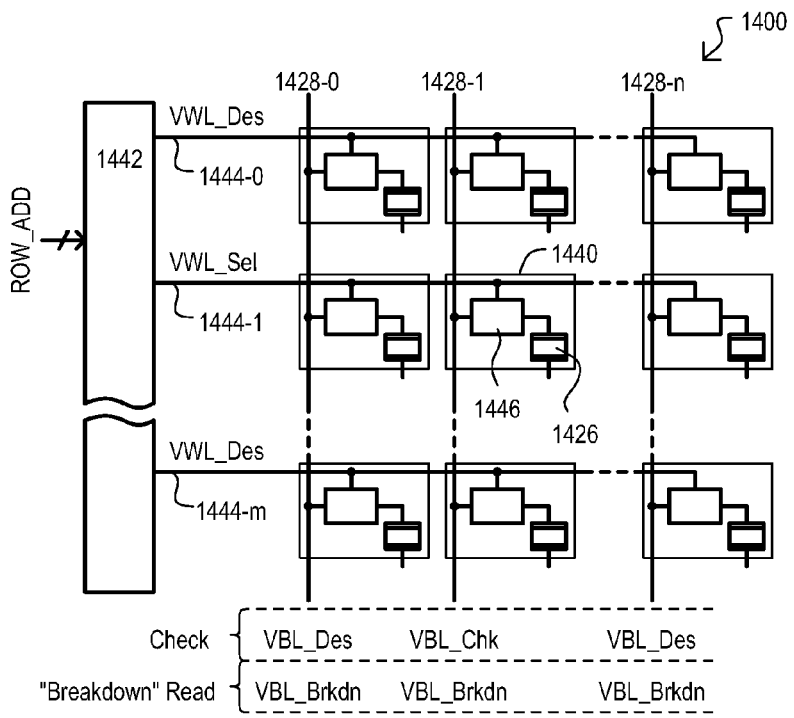
FIG. 14 is a block schematic diagram of a memory device according to an embodiment.

FIG. 14 shows a memory device architecture 1400 according to a particular embodiment. Memory device 1400 can include one or more arrays (one shown as 1440) of memory cells arranged into rows and columns. Each memory cell (e.g., 1440) can include a memory element (e.g., 1426) and an access device (e.g., 1446). A memory element (e.g., 1426) can be programmable between at least two different impedance states, as described herein and equivalents. Memory cells of a same row can be connected to the same word line (1444-0 to -m), while memory cells of a same column can be connected to a same bit line (1428-0 to -n).

A row decoder 1442 can receive row address values, and in response, activate a word line (1444-0 to -m). When activated, a word line (1444-0 to -m) can enable (e.g., makes conductive) corresponding access devices (e.g., 1446), thereby electrically connecting the corresponding memory element (e.g., 1426) to a bit line (1428-0 to -n).

FIG. 14 shows potentials corresponding to the activation of word line 1444-1. Word line 1444-1 can be driven to a select potential (VWL_Sel), while the remaining word lines (1444-0, -m) can remain at a de-select potential (VWL_Des).

FIG. 14 also shows bit line voltages for two possible operations: a selective check operation (shown by row "Check") and a read-to-breakdown operation (shown by "Breakdown" Read). A selective check operation can include a check operation for devices having states like those shown in FIGS. 2A to 2C, or equivalents. In contrast, a "Breakdown" Read operation can show a read operation for device having states like those shown in FIG. 3, or equivalents. In the Check operation of FIG. 14, it is assumed that Check operation applies check conditions to the memory cell 1440, and not other memory cells of the same row. Consequently, bit lines 1428-1 can be driven to a check voltage VBL_Check, while other bit lines (corresponding to cells that will not have check conditions applied) can be placed a voltage VBL_Des.

In the "Breakdown" Read operation, data can be read from all memory cells of a same row, thus all bit lines can be driven to a voltage VBL_Brkdn.

In this way, a memory device with access devices can read data values from memory elements by applying check conditions to induce changes in impedance, and/or that read data values based on variations in breakdown times.

Figures 15A, 15B:
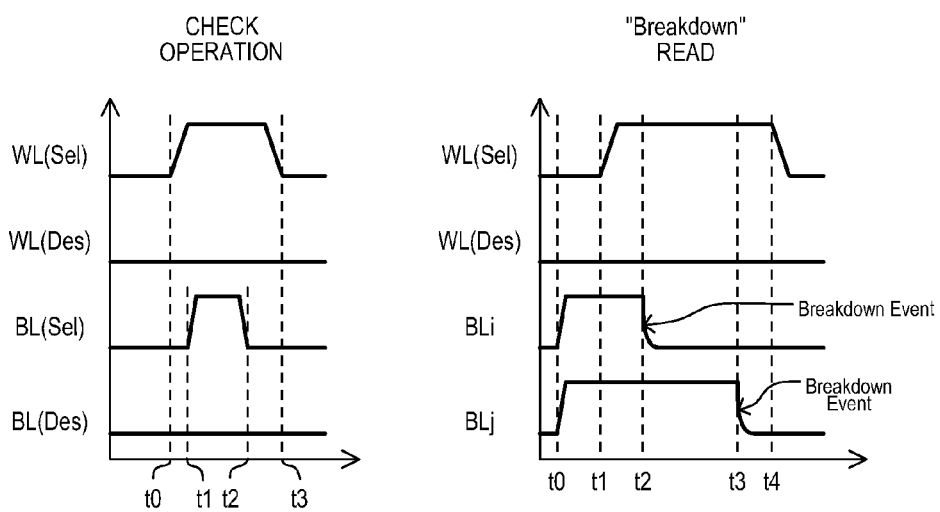
FIGS. 15A and 15B are timing diagrams showing read and related operations that can be included in an embodiment like that of FIG. 14.

FIG. 15A shows one very particular example of a check operation like that noted for FIG. 14. FIG. 15A is a timing diagram having waveforms for a selected word line (WL (Sel)), a de-selected word line (WL(Des)), a selected bit line (BL(Sel)), and a de-selected bit line (BL(Des)).

At about time t0, a selected word line (WL(Sel)) can be driven to a select potential (in this embodiment rise in potential). This can enable (i.e., place into low impedance state) access devices (e.g. 1446) of a corresponding row, connecting memory elements (e.g., 1440) of the accessed row to corresponding bit lines (1428-0 to -n). De-selected word lines (e.g., 1444-0, m) can remain at a de-select potential (which in this embodiment can be a low potential). This can disable (e.g., place into high impedance state) access devices (e.g. 1446) of a non-accessed rows, isolating memory elements (e.g., 1440) of the non-accessed rows from bit lines (e.g., 1428-0 to -m).

At about time t1, a selected bit line BL(Sel) (e.g., 1428-1) can be driven with check voltage (in this embodiment rise in potential). Such a check voltage may result in a change in impedance (or result in no change in impedance) depending upon a state of the accessed element.

At about time t2, a selected bit line BL(Sel) (e.g., 1428-1) can return to a previous level, removing the check conditions from the selected memory element.

At about time t3, a selected word line (WL(Sel)) can return to the de-select potential (in this embodiment, return to a lower potential).

It is noted that in alternate embodiments, bit lines can be maintained at one potential, and opposing terminals (i.e., those terminals opposite the bit lines) of memory elements can be driven to the check potential.

FIG. 15B shows one very particular example of a "Breakdown" Read operation like noted for FIG. 14. FIG. 15B is a timing diagram having waveforms for a selected word line (WL(Sel)), a de-selected word line (WL(Des)), and two bit lines (BLi and BLj).

At about time t0, bit lines (BLi, BLj) can be driven to a breakdown potential (in this embodiment a rise in potential).

At about time t1, a selected word line (WL(Sel)) can be driven to a select potential to enable access devices of the corresponding row. De-selected word lines can be at a de-selected potential, in the same manner as FIG. 15A. Consequently, a breakdown voltage can be applied across memory elements of the corresponding row.

At about time t2, a potential on one bit line BLi can fall, indicating a breakdown event in the corresponding memory element. Such a breakdown event can indicate a first type value is stored in the corresponding memory element.

At about time t3, a potential on bit line BLj can fall, indicating a subsequent breakdown event in the corresponding memory element. Such a breakdown event can indicate a second type value is stored in the corresponding memory element.

Figure 16:
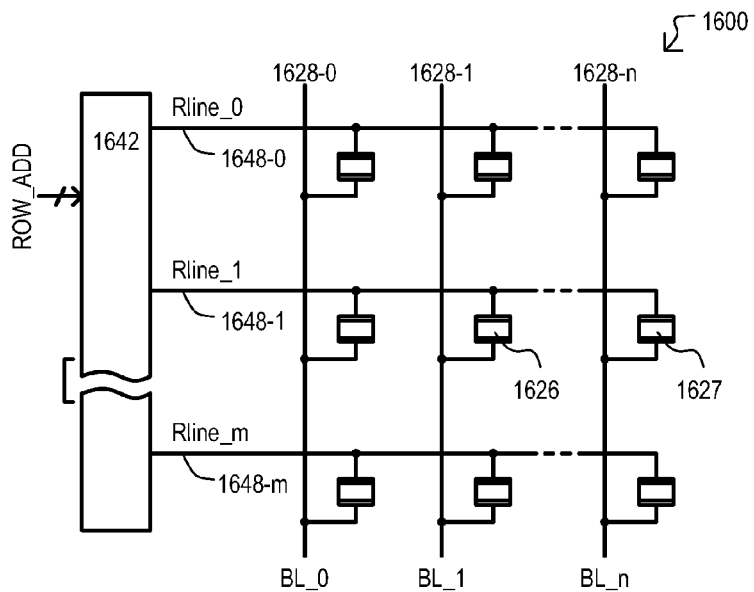
FIG. 16 is a block schematic diagram of a memory device according to another embodiment.

FIG. 16 shows another memory device architecture 1600 according to embodiments. Architecture 1600 shows a "cross-point" array, which can provide an advantageously compact memory size. Memory elements (two shown as 1626, 1627) can be two terminal elements programmable between at least two different states, as described herein and equivalents. Memory elements (e.g., 1626, 1627) of a same row can be connected to the same row line (1648-0 to -m), while memory elements of a same column can be connected to a same bit line (1628-0 to -n).

A row decoder 1642 can receive row address values ROW ADD, and in response, drive row lines (1648-0 to -m) between select and de-select levels. Examples of such levels will be described in more detail below.

In this way, a memory device that reads data values from memory elements by applying check conditions, or relying on variations in breakdown times, can include a cross-point array type architecture.

Figures 17A, 17B:
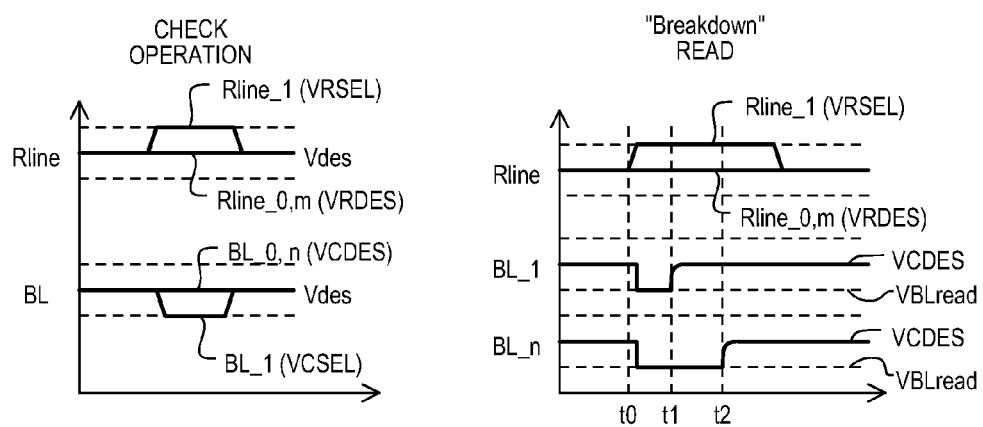
FIGS. 17A and 17B are timing diagrams showing read and related operations that can be included in an embodiment like that of FIG. 16.

FIG. 17A shows a check operation according to one embodiment for a memory device like that shown in FIG. 16.

FIG. 17A is a timing diagram that includes waveforms for row lines (Rline) and bit lines (BL).

In the particular embodiment of FIG. 17A, it is assumed that a check operation results in a check pulse being applied to memory element 1626, and not any other memory elements. Accordingly, a row line 1648-1 (Rline__1) corresponding to the selected memory element 1626 can be driven to a row select voltage (VRSEL), while the other row lines 1648-0, 1648-2 to -m (e.g., Rline__0, Rline__m) can remain at a row deselect voltage (VRDES). In the particular embodiment shown, a row select voltage (VRSEL) can be positive with respect to the row deselect voltage (VRDES).

A bit line 1628-1 (BL__1) corresponding to a selected memory element 1626 can be driven to a column select voltage (VCSEL), while other bit lines 1628-0, 1628-2 to -m (e.g. BL__0, BL_n) can remain at a column deselect voltage (VCDES). A column select voltage (VCSEL) can be negative with respect to the column deselect voltage (VCDES).

It is understood that a check conditions applied across a memory element (VRSEL-VCSEL) can be smaller in potential, shorter in duration, or a combination thereof, as compared to conditions used to write particular values into such a memory element.

FIG. 17B shows a "Breakdown" Read operation according to one embodiment for an architecture like that of FIG. 16. FIG. 17B is a timing diagram showing waveforms for row lines (Rline) and two bit lines (BL__1, BL_n).

In the particular embodiment of FIG. 17B, it is assumed that a read operation accesses the row corresponding to row line 1648-1 (Rline__1). It is also assumed that memory element 1626 is programmed to one state (e.g., a shorter time to breakdown), while memory element 1627 of the same row is programmed to another state (e.g., a longer time to breakdown).

Prior to time t0, row lines (1648-0 to -m) can be driven to a row deselect voltage VRDES, while bit lines (1628-0 to -n) can be driven to a bit line deselect voltage VCDES. In one embodiment, row and column deselect voltages can be a same potential (i.e., VRDES=VCDES).

At about time t0, a row line of a selected row (in this example 1648-1, Rline__1) can be driven to a row select voltage (VRSEL), while the other row lines (e.g., 1648-0, 1648-2 to -m) can remain at a deselect voltage (VRDES). A row select voltage (VRSEL) can be positive with respect to the row deselect voltage (VRDES).

At about the same time, bit lines (1628-0 to -n) can be driven to a bit line read voltage (VBLread), which can be negative with respect to the bit line deselect voltage (VCDES). In the embodiment shown, bit line voltages can return to a de-select voltage when a memory element reaches the "breakdown" state.

In the operation shown in FIG. 17B, at about time t1, memory element 1626 can reach a breakdown state, thus the corresponding bit line BL__1(1628-1) can return to the bit line deselect voltage (VCDES).

Because memory element 1627 is programmed to a different state, at about time t2, memory element 1627 can reach a breakdown state, and corresponding bit line BL_n (1628-*n*) can return to the bit line deselect voltage (VCDES).

It is understood that row/bit line select and de-select voltages of FIG. 17A can be different from those of FIG. 17B.

Figure 18:
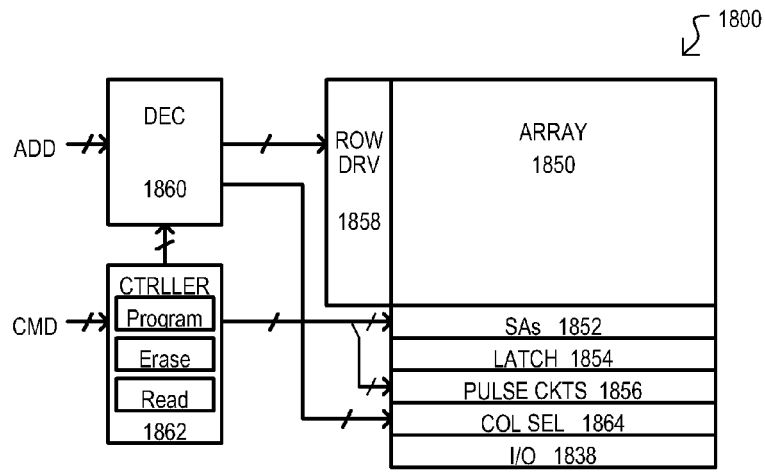
FIG. 18 is a block schematic diagram of a memory device according to an embodiment.

FIG. 18 shows a memory device 1800 according to one embodiment. A memory device 1800 can include an array 1850, a row driver 1858, sense amplifiers 1852, latch circuits 1854, pulse generation circuits 1856, input output (I/O) circuits 1838, a column select circuit 1864, an address decoder 1860, and a controller 1862.

An array 1850 can include a number of memory cells arranged into rows and columns. In some embodiments, each memory cell can include only a memory element (e.g., a cross-point array), while in other embodiments each memory cell can include one or more access devices and one or more memory elements. Rows of memory cells within array 1850 can be activated or accessed by a row driver circuit 1842. Memory cells within array 1850 can store data in binary, or multi-bit (i.e., more than two states) form. Memory elements within array 1850 can be programmed between two or more different impedance states. In particular embodiments, such different impedance states result in different dynamic responses during a read operation.

Sense amplifiers 1852 can read data values from a row of accessed memory cells. Sense amplifiers 1852 can be circuits suitable for detecting a state of a programmable impedance element (or elements) of accessed memory cells. As but two examples, sense amplifiers can be current or voltage sense amplifiers. Sense amplifiers 1852 can compare sensed signals to one or more threshold levels to generate sensed data values.

Latch circuits 1854 can latch sensed data values generated by sense amplifiers 1852. In contrast to conventional memory devices, in some embodiments data values initially latched in latch circuits 1854 are not necessarily the data values output from memory devices.

Pulse generation circuits 1856 can generate electrical pulses of predetermined amplitude and duration to enable data values to be written (e.g., programmed and/or erased) into memory cells of array 1850. In addition, pulse generation circuit 1856 can generate electrical pulses to subject programmable impedance elements to check conditions that can confirm a read data value, as described herein and equivalents. In addition or alternatively, pulse generation circuit 1856 can generate read electrical pulses to read data values based on breakdown time of memory elements within array 1850.

I/O circuits 1838 can provide output read data paths and input write data paths to array 1850.

Column select circuits 1864 can selectively connect columns of array 1850 to I/O circuits 1838 based on column select values provided from address decoder 1860. Column select circuits 1864 can be placed between sense amplifiers 1852 and I/O circuits 1838 (e.g., a sense amplifier is provided for every array column), or alternatively, between sense amplifiers 1852 and array 1850 (e.g., each sense amplifier is multiplexed between multiple array columns).

Address decoder 1860 can receive address values ADD, and generate row select and column select values for row driver 1858 and column select circuits 1864, respectively.

A controller 1862 can receive command information (CMD), and in response, generate control signals for sense amplifiers 1852, latch circuits 1854, and pulse generation circuits 1856, according to a determined mode of operation. In the very particular embodiment shown, a controller 1862 can include circuits for enabling program and erase operations.

In addition, unlike conventional memory devices, a controller 1862 can generate signals that enable read operations according to the various embodiments described herein, and equivalents, including read operations that apply "check" conditions and/or read operations that determine a data value based on a time to breakdown.

Figure 19:
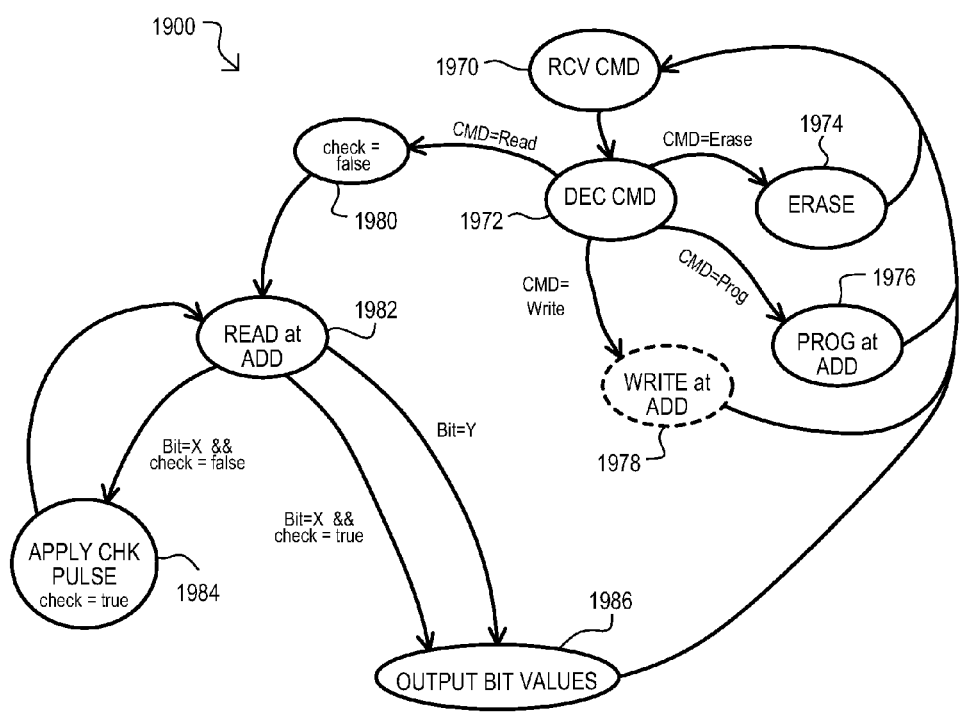
FIG. 19 is a state diagram of operations that can be executed by a memory device like that of FIG. 18.

FIG. 19 shows one example of operations executable by a controller, such as that shown as 1862 in FIG. 18. The embodiment of FIG. 19 shows controller operations that can execute read operations that apply check conditions, as described herein and equivalents.

In the particular embodiment shown, it is assumed that memory elements can be programmed to one impedance state and erased to another impedance state.

Upon receiving a command (1970) a controller can decode command data (1972). If a command indicates an erase operation (CMD=Erase), a controller can generate signals for erasing memory cells at one or more addresses (1974). In some embodiments, a controller can generate control signals that cause one or more electrical pulses of one polarity to be applied to memory cells within an array. Such signals can place the memory cells into one impedance state. In some embodiments, an erase operation can erase memory cells in predetermined logical groups (i.e., sectors, pages, etc.). However, in other embodiments, an erase operation can be directed to one addressable location (i.e., byte, word, double-word, etc.).

If a command indicates a program operation (CMD=Prog), a controller can generate signals for writing a particular data value to memory cells at one or more addresses (1976). As but one example, a controller can generate control signals that cause one or more electrical pulses of a second polarity to be applied to memory cells within an array. Such pulses can place memory elements in a different state than the erase state. In some embodiments, a program operation can be preceded by an erase operation. That is, a group of memory cells can be erased, and then selected of the erased memory cells can be programmed.

Alternatively, a controller can execute decoded write operations (as opposed to program/erase operations) (CMD=Write). In such a case, a controller can generate signals for applying electrical pulses of different types to memory cells based on received write data (1978).

If a command indicates a read operation (CMD=Read), a controller can indicate that check conditions have not been applied for the current read operation (1980). A controller can then generate signals to activate read circuits (e.g., sense amplifiers) to read data values at a read address (1982). If a read data bit has one value (Bit=Y), such data can be output as read data (1986). If a read data bit as another value, and check conditions have not yet been applied (Bit=X && check=false), a check pulse can be applied and a controller can indicate check conditions have occurred for the bit (1984). Following a check pulse, a second read operation can be performed. If a read data bit as another value, and check conditions have been applied (Bit=X && check=true), such data can be output as read data (1986).

In this way, a memory device my include a controller for executing a "two read" operation that enables reading data from memory cells, applying a check pulse to such memory cells, and then confirming the read data values.

Figure 20:
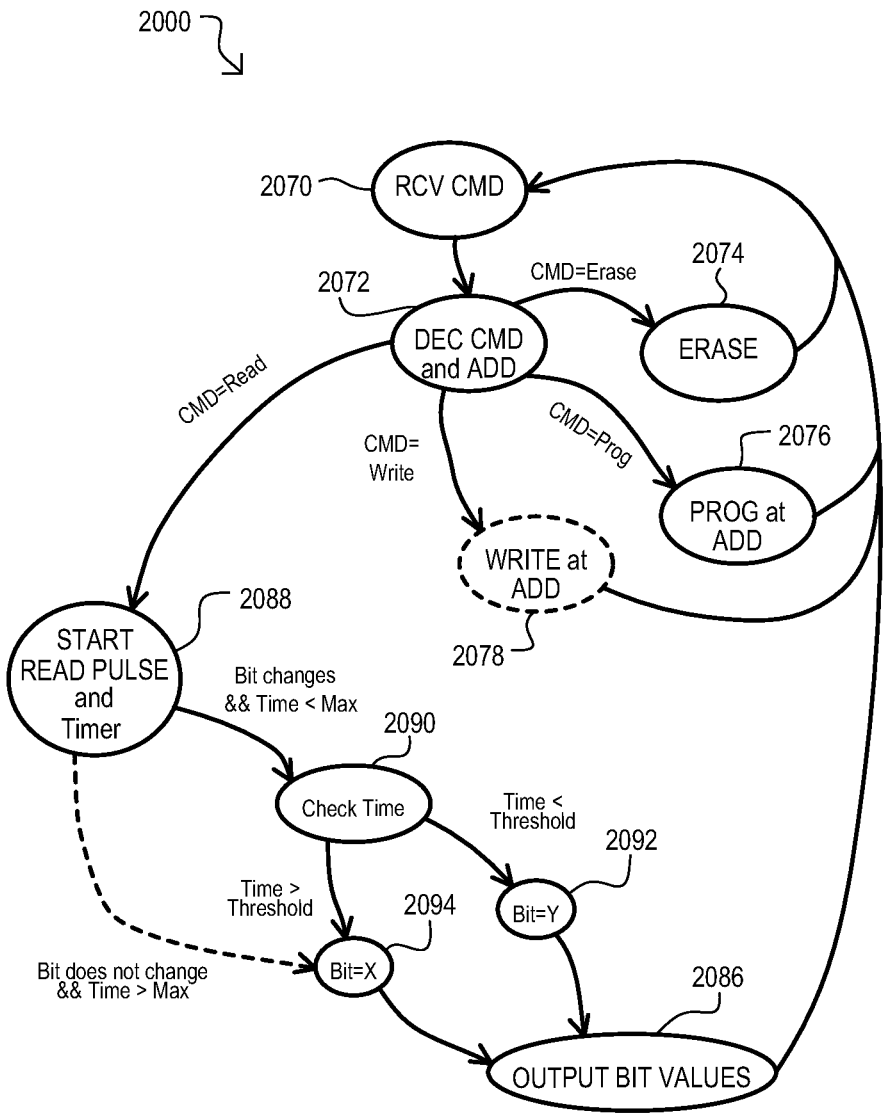
FIG. 20 is a state diagram of other operations that can be executed by a memory device like that of FIG. 18.

FIG. 20 shows operations executable by a controller, such as that shown as 1862 in FIG. 18, according to another embodiment. The embodiment of FIG. 20 shows an example of a controller that can execute read operations that determine data values based on a time to breakdown of an accessed memory element.

Upon receiving a command (2070) a controller can decode command data (2072) to perform erase (2074), program (2076), or alternatively write operations (2078), in a manner like that described above for FIG. 19. However, it is understood that such operations can establish different breakdown times for such data elements.

Referring still to FIG. 20, if a command indicates a read operation (CMD=Read), a controller can start a read pulse and timer (2088). If a bit value changes within a time limit (Bit Changes && Time<Max), a time value can be checked (2090). If a time is less than a threshold (Time<Threshold), a bit value can be determined to have one value (Bit=Y) (2092) and such a bit value can be output as read data (2086). If a time is greater than a threshold (Time>Threshold), a bit value can be determined to have another value (Bit=X) (2092) and output as read data (2086).

In the very particular embodiment shown, if a bit value does not change within a predetermined limit (Bit does not change && Time>Max), a bit value can be determined to have a particular value (Bit=X) (2092) and can be output as read data (2086).

While FIG. 20 shows a controller determining two data values, with additional threshold times, a same approach can determine more than two data values.

While the embodiments have shown read operations that can measure impedance change in response to check conditions, or impedance change over time, other embodiments can include combinations of such read methods.

It is understood that other embodiments can utilize conventional memory read operations in conjunction with those described herein. In one embodiment, a memory device can employ conventional read operations (e.g., compare memory element resistance to threshold to determine data stored) under predetermined conditions. Such conditions can include: the storage location has previously been accessed within a certain period of time, the storage location is below a wear threshold level (i.e., the number of program and/or erase operations), the device is operating in a higher voltage mode (voltages applied to elements is increased), as but a few examples.

A memory device and method according to the embodiments may be included in a standalone memory device (i.e., a memory device providing substantially only storage functions). In alternate embodiments, such a memory device may be embedded into larger integrated circuit device.

It should be appreciated that in the foregoing description of exemplary embodiments, various features are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

It is also understood that the embodiments of the invention may be practiced in the absence of an element and/or step not specifically disclosed. That is, an inventive feature of the invention can be elimination of an element.

Accordingly, while the various aspects of the particular embodiments set forth herein have been described in detail, the present invention could be subject to various changes, substitutions, and alterations without departing from the spirit and scope of the invention.

What is claimed is:

1. A memory device, comprising:
a plurality of programmable elements;
at least one sense circuit that generates sense data values from detected impedances of accessed programmable elements; and
at least one data store circuit that stores initial data values from the at least one sense circuit, and stores output data values from the at least one sense circuit after check conditions have been applied to at least one programmable element; wherein
the check conditions can induce a change in impedance for programmable elements programmed to a predetermined state.

2. The memory device of claim 1, wherein:
each programmable element comprises an ion conductor material disposed between two electrodes.

3. The memory device of claim 1, wherein:
the at least one sense circuit includes a plurality of current sense amplifiers that generate digital sense values in response to an amount of current flowing through a corresponding accessed programmable element.

4. The memory device of claim 1, further including:
at least one check circuit that applies the check conditions to programmable elements in response to any of the initial data values having at least one predetermined logic value.

5. The memory device of claim 4, wherein:
the check circuit includes pulse generator circuits that output electrical pulses as the check conditions.

6. The memory device of claim 5, wherein:
the pulse generator circuits include selective pulse generator circuits, each selective pulse generator circuit selectively applying at least one electrical pulse to a corresponding programmable element according to the initial data value generated for the corresponding programmable element.

7. The memory device of claim 5, wherein:
the pulse generator circuits include at least one non-selective pulse generator circuit, the non-selective pulse generator circuit applying at least one electrical pulse to the accessed programmable elements regardless of the initial data values generated for the accessed programmable elements.

8. The memory device of claim 5, wherein:
each pulse generating circuit outputs first type electrical pulses when applying the check conditions, and outputs second type electrical pulses when programming programmable elements into particular states.

9. The memory device of claim 8, wherein:
the first type pulses have a smaller magnitude than the second type pulses.

10. The memory device of claim 8, wherein:
the first type pulses have a shorter duration than the second type pulses.

11. The memory device of claim 8, wherein:
the first type pulses include fewer sequential pulses than the second type pulses.

12. The memory device of claim 1, wherein:
the at least one sense circuit senses data values by determining if impedances of programmable elements change within a predetermined time period in response to at least one electrical pulse.

13. The memory device of claim 1, wherein:
at least one check circuit comprising a timer coupled to the at least one sense circuit that provides a timing signal corresponding to the predetermined time period to measure a time to breakdown in the programmable elements.

14. The memory device of claim 1, wherein:
the at least one sense circuit comprises
sense amplifiers that compare signals generated with the accessed programmable elements to a first threshold value to generate the initial data values, and compare signals generated with programmable elements to a second threshold value after the check conditions have been applied.

15. The memory device of claim 1, wherein:
the at least one sense circuit comprises
sense amplifiers that compare signals generated with the accessed programmable elements to a first threshold value to generate the initial data values, and compare signals generated with programmable elements to the first threshold value after the check conditions have been applied.

16. The memory device of claim 1, further including:
a controller configured to place the programmable elements into one of a plurality of different states.

17. The memory device of claim 16, wherein:
the different states include different impedance responses under read conditions.

18. The memory device of claim 16, wherein:
the different states include different time to breakdown values, a time to breakdown value being the time required to induce an impedance change in a programmable element in response to applied electrical conditions.

19. The memory device of claim 1, further including:
at least one cross point array having programmable elements arranged into rows and columns, each programmable element of the same row have first terminals with direct electrical connections to a same row line and second terminals with a direct electrical connection to a same column line.

20. The memory device of claim 1, further including:
at least one memory array, the memory array comprising memory cells arranged into rows and columns, each memory cell including at least one access device and at least one programmable element, the access devices of the same row being connected to a same word line.

21. The memory device of claim 1, further including:
each programmable element comprises a programmable oxide layer.

22. The memory device of claim 21, wherein:
the programmable oxide layer is a metal oxide.

23. The memory device of claim 21, wherein:
the programmable oxide layer is a transition metal oxide.

24. The memory device of claim 21, wherein:
the programmable oxide layer is selected from the group of: silicon oxide, titanium oxide, and copper oxide.

25. The memory device of claim 1, further including:
each programmable element comprises a non-metal oxide layer.

26. A method, comprising:
reading data from at least one memory cell of a memory device comprising a plurality of such memory cells;
if the read data has a first value, providing such data as an output value; and
if the read data has a second value, repeating access to the memory cell to confirm the read data value; wherein
confirming the read data value includes comparing a read signal level generated from the memory cell to a check reference level, the read signal level varying according to an impedance of the memory cell.

27. The method of claim 26, wherein:
determining if the read data has a first or second value includes comparing a read signal generated from the memory cell to a read reference level.

28. The method of claim 27, wherein:
the read reference level is substantially the same as the check reference level.

29. A method, comprising:
reading data from at least one memory cell of a memory device comprising a plurality of such memory cells;
if the read data has a first value, providing such data as an output value; and
if the read data has a second value, repeating access to the memory cell to confirm the read data value; wherein
confirming the read data value includes making a breakdown time determination of a programmable element in the memory cell.

30. The method of claim 29, wherein:
the programmable element comprises a dielectric formed between two electrodes, and the breakdown time determination includes determining if a substantially conductive path is formed through the dielectric within a predetermined time limit.

31. The method of claim 29, wherein:
the programmable element comprises a dielectric formed between two electrodes, and the breakdown time determination includes determining the time required to form a substantially conductive path through the dielectric.

32. A method, comprising:
reading data from at least one memory cell of a memory device comprising a plurality of such memory cells;
if the read data has a first value, providing such data as an output value; and
if the read data has a second value, repeating access to the memory cell to confirm the read data value; wherein
confirming the read data value includes applying check conditions to the memory cell, the check conditions applying less energy to the memory cell than that used to establish a data state of the memory cell.

33. The method of claim 32, wherein:
confirming the read value further includes checking for a change in impedance of the memory cell after applying the check conditions.

\* \* \* \* \*